United States Patent [19]
Kusumoto et al.

[11] Patent Number: 6,093,667
[45] Date of Patent: Jul. 25, 2000

[54] CERAMICS WITH EXCELLENT ELECTROSTRICTIVE PROPERTY

[75] Inventors: Keiji Kusumoto; Tadashi Sekiya, both of Aichi, Japan

[73] Assignee: Agency of Industrial Science and Technology, Tokyo, Japan

[21] Appl. No.: 09/248,317

[22] Filed: Feb. 11, 1999

[30] Foreign Application Priority Data

Jun. 9, 1998 [JP] Japan .................................. 10-176590

[51] Int. Cl.$^7$ ...................... C04B 35/499; C04B 35/472; B28B 1/00
[52] U.S. Cl. ................... 501/134; 252/62.9 R; 264/614; 264/646; 264/655; 264/658
[58] Field of Search ....................... 252/62.9 R; 501/134; 264/614, 646, 655, 658

[56] References Cited

U.S. PATENT DOCUMENTS 5,786,048 7/1998 Gesemann et al. .................... 428/34.6

OTHER PUBLICATIONS

Kenji Uchino, et al."From Piezoelectric/Electrostriction Actuator Fundamentals to Their Actual Use", (1994), no month provided, pp.45–55.

L.E. Cross, et al. "Large Electrostrictive Effects in Relaxor Ferroelectrics", Ferroelectrics, vol. 23 (1980), no month provided, pp. 187–191.

J.H. Park, et al. "Electric–Field Induced Strains and Pyroelectric Coefficients in Lead Magnesium Niobate–Lead Titanate Solid Solutions", Materials Research Bulletin vol. 30, No. 4, (1995), no month provided, pp. 435–441.

J. Zhao, et al. "Electromechanical Properties of Relaxor Ferroelectric Lead Magnesium Niobate–Lead Titanate Ceramics", Jpn. J. Appl. Phys., vol. 34, (1995), no month provided, pp. 5658–5663.

Seiji Takahashi, et al. "Preparation of $Pb(Ni_{2/3}Nb_{1/3})O_3$ Thin Film by Sol–Gel Method", Journal of the Ceramic Society of Japan, vol. 103 [7], (1995), no month provided, pp. 660–663 ( with English Abstract).

Hisao Banno, et al. "Phase Diagram and Piezoelectric Properties of $Pb(Nb_{2/3}Ni_{1/3})O_3$ $PbTiO_3$ –$PbZrO_3$ and an Application to Ceramic Wave Filter", Proceedings of the $1^{st}$ Meeting on Ferroelectric Materials and their applications, (1984), no month provided, pp. 339–344.

*Primary Examiner*—David Brunsman
*Attorney, Agent, or Firm*—Oblon, Spivak, McClelland, Maier & Neustadt, P.C.

[57] ABSTRACT

The present invention provides novel ceramic materials with excellent electrostrictive property, and the present invention relates to electrostrictive ceramics consisting of solid solution ceramics which can be obtained by combining about 30 molar % of primitive perovskite-type compound $PbTiO_3$ with a composite perovskite compound $Pb(Ni_{1/3}Nb_{2/3})O_3$.

3 Claims, 2 Drawing Sheets

○: $0.71Pb(Ni_{1/3}Nb_{2/3})O_3 \cdot 0.29PbTiO_3$

●: $0.7Pb(Ni_{1/3}Nb_{2/3})O_3 \cdot 0.3PbTiO_3$

CERAMICS WITH EXCELLENT ELECTROSTRICTIVE PROPERTY

TECHNICAL FIELD

The present invention relates to electrostrictive ceramics, which have recently received attention as ceramic actuator materials, and in further detail, to electrostrictive ceramic materials comprising $Pb(Ni_{1/3}Nb_{2/3})O_3$—$PbTiO_3$ solid solution having markedly excellent electrostrictive property than that of conventional electrostrictive ceramics, and a method of producing these solid solution ceramics. The electrostrictive ceramics of the present invention are useful as materials for solid displacement elements and practical use of electrostrictive ceramic actuators will probably be promoted and their application fields will be expanded by using this materials for the solid displacement elements, typically actuators.

BACKGROUND ART

The importance of ceramic actuators as solid displacement elements has increased in recent years with the development of miniaturized, intelligent electronic equipment. Today piezoelectric ceramics and electrostrictive ceramics are known as ceramic actuator materials, and with respect to the piezoelectric ceramics, they have already been used in many fields. On the other hand, although electrostrictive ceramics do have preferable actuator properties than piezoelectric-ceramics, it is difficult to synthesize pure compounds by conventional ceramic synthesis methods and the amount of displacement of electrostrictive ceramics that are obtained by conventional method is approximately half compared with that of piezoelectric ceramics. Therefore, practical use of electrostrictive ceramics for displacement elements has been delayed. Since electrostrictive ceramic actuators have advantages in that their hysteresis and change over time in strain are less than that of piezoelectric ceramic actuators, their use is expected in fields where high accuracy and precise control of the amount of displacement are required (reference: "From Piezoelectric/Electrostrictive Actuator, Fundamentals to their Actual Use": Kenji Uchino, Morihoku Shuppani 1994).

Today a solid solution of the composite perovskite-type compound $Pb(Mg_{1/3}Nb_{2/3})O_3$ (referred to as PMN below) and the primitive perovskite-type compound $PbTiO_3$ (referred to below as PT), that is a so-called PMN-PT solid solution, is being developed as an electrostrictive ceramics for practical use. This compound shows an extremely high relative dielectric constant at room temperature in the region of a composition of approximately 0.9 PMN-0.1 PT, and generates relatively large electric-field induced strain (~1 $\mu$m/mm). However, this amount of strain is about half compared with that of $(Pb, La)(Zr, Ti)O_3$ solid solution (PLZT), which, of the piezoelectric ceramics, is known to generate particularly large electric-field induced strain, and is not sufficient for an actuator material. Furthermore, the composition of a PMN-PT solid solution with which extreme strain is obtained has a high ratio of $Nb_2O_5$, which is expensive, and it is difficult to obtain single-phase perovskite by ordinary ceramic synthesis methods. Thus, there is a problem with the current electrostrictive ceramics in that in addition to the fact that the amount of displacement that is obtained is small, the degree of freedom of material design is very limited.

Therefore, the inventors performed intense studies of electrostrictive materials showing large displacement in light of the above-mentioned prior art and as a result, they completed the present invention upon discovering that $Pb(Ni_{1/3}Nb_{2/3})O_3$—$PbTiO_3$ solid solution, which is known to show the same very high relative dielectric constant as PMN-PT solid solution, has an excellent electrostrictive property and is useful as electrostrictive material. This solid solution is known to have a very high relative dielectric constant near room temperature when 30 molar % primitive perovskite-type compound $PbTiO_3$ is made into a solid solution with the composite perovskite-type compound $Pb(Ni_{1/3}Nb_{2/3})O_3$ (referred to below as PNN). However, it is difficult to obtain single-phase particles of perovskite in a PMN-PT solid solution by conventional ceramic synthesis methods and therefore, there-has been very little research of its properties. Nevertheless, as a result of showing that particles of high purity can be easily obtained by the synthesis methods developed by the present inventors in recent years, they have discovered that this material has excellent electrostrictive properties and is useful as electrostrictive ceramic.

SUMMARY OF INVENTION

The present invention provides novel ceramic materials with excellent electrostrictive property.

The present invention relates to electrostrictive material ceramics comprising solid-solution ceramics where the primitive perovskite-type compound $PbTiO_3$ is contained in the region of 30 molar % to the composite perovskite-type compound $Pb(Ni_{1/3}Nb_{2/3})O_3$, and to a method of producing said solid-solution ceramics.

When the materials developed by the present invention are used in solid displacement elements, typically ceramic actuators, electrostrictive ceramic actuators which show displacement that is several times compared with that of $Pb(Mg_{1/3}Nb_{2/3})O_3$—$PbTiO_3$ solid solutions, which are now being tested for practical use as electrostrictive ceramic actuators, are newly provided at a low cost. Moreover, since the electrostrictive ceramics have theoretically little hysteresis and change over time in their strain, and the problems with the amount of strain that is generated can be solved by this invention, their use can be. expected in fields where piezoelectric ceramic actuators have already been used, and therefore, the industrial value of the present invention is very great.

DISCLOSURE OF INVENTION

The object of the present invention is to provide a novel electrostrictive material having excellent electrostrictive properties that are much better than those of conventional electrostrictive ceramics.

Moreover, the object of the present invention is to provide a method of producing a $Pb(Ni_{1/3}Nb_{2/3})O_3$—$PbTiO_3$ solid solution that is useful as the above-mentioned electrostrictive material by a relatively simple synthesis process.

The present invention, which solves the above-mentioned subjects, comprises the following technological means:

(1) An electrostrictive ceramic having excellent electrostrictive property, comprising a solid-solution ceramic which can be obtained by combining a 26 to 34 molar % of primitive perovskite-type compound $PbTiO_3$ with a composite perovskite-type compound $Pb(Ni_{1/3}Nb_{2/3})O_3$.

(2) A method of producing the $Pb(Ni_{1/3}Nb_{2/3})O_3$—$PbTiO_3$ solid solution ceramic defined in (1), which comprises-mixing tin oxide (PbO), nickel oxide (NiO), niobium oxide ($Nb_2O_5$), and titanium oxide ($TiO_2$), forming the mixture, heat treating the formed body in air, and next, dissolving unreacted product, separating particles of product, forming the particles, and then sintering the product in a PbO atmosphere to obtain the sintered body.

(3) The above-mentioned method of producing a solid solution ceramic in (2), where heat treatment of the formed body is performed in air at 850 to 1,000° C.

(4) The above-mentioned method of producing a solid solution ceramic in (2), where after the particles of product are formed, they are sintered in a PbO atmosphere at 1,100 to 1,300° C. to obtain the sintered body.

The present invention will now be explained in further detail:

The present invention, which solves the above-mentioned subjects, relates to a novel electrostrictive material $Pb(Ni_{1/3}Nb_{2/3})O_3$-$PbTiO_3$ solid solution having much better electrostrictive properties than conventional electrostrictive ceramics. By using this compound as an actuator material, the problems of conventional electrostrictive ceramic actuators will be solved and actual use of electrostrictive ceramic actuators will be promoted.

By means of the present invention, a solid solution ceramic comprising a solid solution of 26 to 34 molar % primitive perovskite-type compound $PbTiO_3$ to the composite perovskite-type compound $Pb(Ni_{1/3}Nb_{2/3})O_3$ is made. It is known that it is extremely difficult to obtain single-phase perovskite with this solid solution by conventional ceramic synthesis methods, but particles with a perovskite single phase can be obtained by a relatively simple synthesis process using the method developed by the inventors.

By means of this method, lead oxide (PbO), nickel oxide (NiO), niobium oxide ($Nb_2O_5$), and titanium oxide ($TiO_2$) are used as the starting materials. After these materials have been mixed to the desired ratio, for instance, $5PbO+0.7NiO+0.7Nb_2O_5+0.9TiO_2$, the mixture is formed into any shape, such as tablets, square rods, etc., and heat treated in air for 0.5 to 2 hours at, preferably, 850 to 1,000° C. wet mixing, dry mixing are given as preferred examples of the method of mixing the materials, mold pressing and wet pressing are given as examples of the forming method, and heating in air is given as the preferred example of the heat treatment method, but these methods are not limited to these examples.

The unreacted product is dissolved from the material that has been heat treated using an acidic aqueous solution, for instance, an aqueous 1 N acetic acid solution and the particles of product are separated by filtration. Next, the particles that are obtained are formed with a mold pressing device and the like and sintered for 0.5 to 2 hours at 1,100 to 1,300° C. in a PbO atmosphere to make a sintered body. Ordinary sintering methods, pressurized sintering methods, etc., are examples of the sintering method, but the sintering means is not limited to these examples.

By means of the method of the present invention, it is important to add excess PbO to the perovskite composition, and to perform heat treatment in air 850° C. or higher. There is a clear increase in the yield of the perovskite phase of materials where excess PbO has been added to the perovskite composition, as will be mentioned later. Moreover, single-phase perovskite is obtained by heat treatment at 850° C. or more.

The solid-solution ceramics of the present invention are synthesized by the above-mentioned method, but a solid solution comprising 26 to 34 molar %, preferably 28 to 31 molar %, more preferably 29 molar % of primitive perovskite PT to the composite perovskite PNN should be used. The PNN-PT solid solution of the present invention can exhibit strain (~1 micron/mm) that is better than that of conventional electrostrictive materials (PMN-PT) in the region of the above-mentioned composition (composition of approximately 30 molar % $PbTiO_3$).

The solid solution synthesized by the method of the present invention has 1~3 $\mu$m cubic particles with excellent dispersibility and by sintering these particles, a compact sintered body with a relative density of 90% or higher is obtained.

It is extremely difficult to produce a perovskite single phase in $Pb(Ni_{1/3}Nb_{2/3})O_3$—$PbTiO_3$ solid solutions by conventional ceramic synthesis processes, but by using the synthesis method developed by the inventors of the present invention, a perovskite single phase can be obtained. As a result, it has been possible to utilize the excellent electrostrictive properties of the solid solutions of the ceramics in this fields.

BEST MODE FOR CARRYING OUT THE INVENTION

Figure 1:
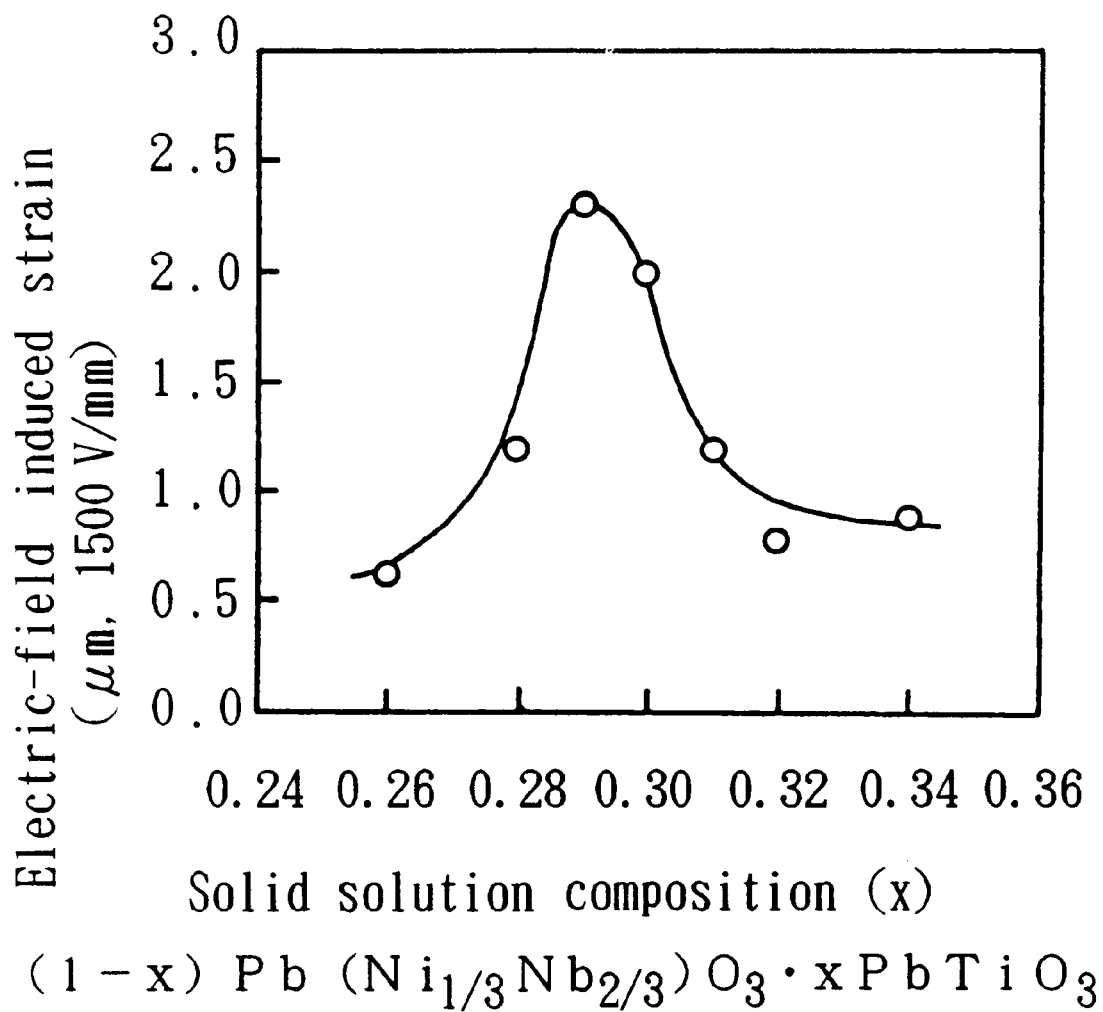
FIG. 1 is an explanatory diagram showing the correlation between electric-field induced strain and composition of a sintered body made by the method in the Examples at an applied electric-field of 1,500 V/mm at room temperature.
Figure 2:
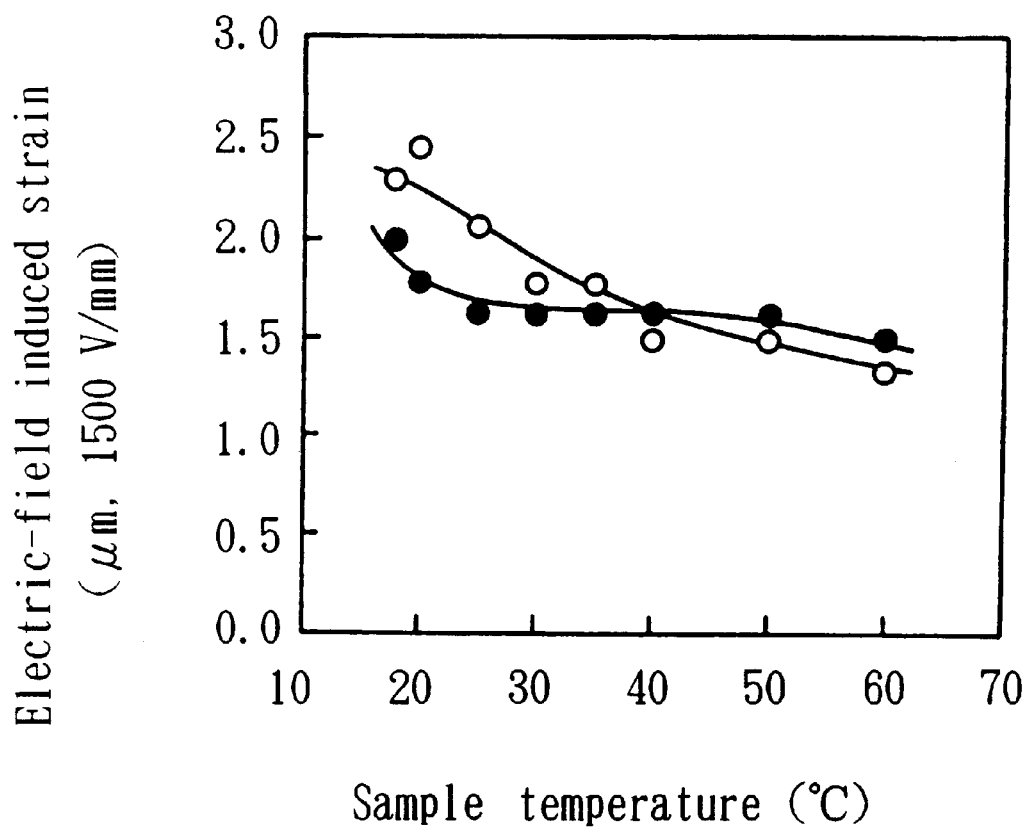
FIG. 2 is an explanatory diagram showing the correlation between the electric-field induced strain of a sintered body made by the method in the Examples and temperature at an applied electric-field of 1,500 V/mm.

The present invention will be explained hereafter in detail with actual Examples. However, the present invention is in no way-limited to these Examples.

EXAMPLE 1

The ceramics synthesized in the present examples are solid solutions of the composite perovskite-type compound $Pb(Ni_{1/3}Nb_{2/3})O_3$ and the primitive perovskite-type compound $PbTiO_3$ (Pt), so called PNN-PT solid solutions. It is known that it is very difficult to obtain a single phase of perovskite with this compound by conventional ceramic synthesis methods. However, singe-phase perovskite particles were obtained by a relatively simple synthesis procedure by using the epoch-making synthesis method described below:

By means of the present example, x=0.26–0.34 particles were synthesized in a (1–x)PNN.xPT solid solution. Special grade reagents lead oxide (PbO), nickel oxide (NiO), niobium oxide ($Nb_2O_5$), and titanium oxide ($TiO_2$) were used as the starting materials. After wet mixing these starting materials to a specific ratio, they were formed into tablets and heat treated for 1 hour in air at 800 to 1,000° C. Unreacted product was dissolved from the sample that had been heat treated using aqueous 1 N acetic acid solution to separate the particles of product. The particles that were obtained were formed and then sintered for 2 hours at 1,270° C. in a PbO atmosphere to make a sintered body. Dielectric properties and electrostrictive properties were investigated by using an impedance analyzer and strain gauge.

As a result, in the cases of materials where excess PbO has been added to the perovskite composition, it has been shown that there is a clear increase in the yield of the perovskite phase, and also a perovskite single phase can be obtained by heat treating at 850° C. or higher. The starting composition and the yield of perovskite phase of particles that were synthesized by heating for 1 hour using the starting composition to synthesize 0.7 PNN.0.3 PT particles in various heat treatment temperatures are shown in Table 1 as typical examples.

TABLE 1

| Starting composition | Yield of perovskite at various heat treatment temperatures (%) | | | |
|---|---|---|---|---|
| | 800° C. | 850° C. | 900° C. | 950° C. |
| $3PbO + 0.7NiO + 0.7Nb_2O_5 + 0.9TiO_2$ | — | 56 | 76 | 78 |
| $4PbO + 0.7NiO + 0.7Nb_2O_5 + 0.9TiO_2$ | — | 88 | 86 | 93 |
| $5PbO + 0.7NiO + 0.7Nb_2O_5 + 0.9TiO_2$ | 23 | 100 | 100 | 100 |

The solid solutions synthesized by the present synthesis method were 1~3 μm cubic particles with excellent dispersibility and compact sintered bodies with relative density of 90% or greater were obtained by sintering. When the dielectric properties of these sintered bodies were investigated, all of the samples showed a very high relative dielectric constant and diffuse changes of the relative dielectric constant with temperature. Moreover, when electrostrictive properties were investigated, strong electric-field induced strains were generated with all samples, and particularly, it has been revealed that the 0.71 PNN. 0.29 PT and the 0.7 PNN.0.3 PT sintered bodies show strong strains near room temperature and relatively small temperature dependency of the strains.

The point to be emphasized in the examples is that the obtained sintered bodies show strong electric-field induced strains near room temperature. The amount of the strains observed with the 0.71 PNN.0.29 PT and the 0.7 PNN.0.3 PT sintered bodies, in particular, are phenomenal at 2-fold to 3-fold compared with the strain obtained with PMN-PT electrostrictive materials and are the same as that of PLZT solid solutions.

As was previously explained in detail, the present invention relates to electrostrictive ceramics consisting of a solid solution containing 26 to 34 molar % of primitive perovskite-type compound $PbTiO_3$ to the composite perovskite-type compound $Pb(Ni_{1/3}Nb_{2/3})O_3$, and by means of the present invention, it can be possible to provide novel high-performance electrostrictive ceramic materials with excellent electrostrictive properties than conventional electrostrictive ceramic materials.

Moreover, in contrast to the fact that the ratio of expensive niobium oxide is high in compositions of PMN-PT solid solution (0.9.PMN.0.1 PT) showing large displacement, the material developed by the present invention has a relatively low niobium oxide ratio and therefore, reduced cost of electrostrictive ceramic actuators can be expected when the material of the present invention is actually used as an electrostrictive material. Moreover, since electrostrictive ceramics theoretically show little hysteresis or change over time of strain, the problems with displacement properties can be solved. Therefore, the use of electrostrictive ceramics will be promoted in fields where conventional piezoelectric ceramic actuators are being used. Consequently, the present invention is very valuable industrially.

What is claimed is:

1. A method of producing an electrostrictive $Pb(Ni_{1/3}Nb_{2/3})O_3$—$PbTiO_3$ solid solution ceramic, which comprises mixing lead oxide (PbO), nickel oxide (NiO), niobium oxide ($Nb_2O_5$), and titanium oxide ($TiO_2$), forming the mixture into a body, heat treating the formed body in air, and next, dissolving unreacted product, separating particles of product, forming the particles, and then sintering the product in a PbO atmosphere to obtain the sintered body.

2. The above-mentioned method of producing a solid solution ceramic in claim 1, where heat treatment of the formed body is performed in air at 850 to 1,000° C.

3. The above-mentioned method of producing a solid solution ceramic in claim 1, where after the particles of product are formed, they are sintered in a PbO atmosphere at 1,100 to 1,300° C. to obtain the sintered body.

* * * * *

UNITED STATES PATENT AND TRADEMARK OFFICE
CERTIFICATE OF CORRECTION

PATENT NO. : 6,093,667

DATED : July 25, 2000

INVENTORS : Keiji KUSUMOTO, et al.

It is certified that an error appears in the above-identified patent and that said Letters Patent is hereby corrected as shown below:

On the title page [73] Assignee, delete "Agency of Industrial Science and Technology, Tokyo, Japan" and insert therefor --Japan as represented by Director General of Agency of Industrial Science and Technology, Tokyo Japan--.

Signed and Sealed this

Twenty-fourth Day of April, 2001

Attest:

NICHOLAS P. GODICI

Attesting Officer

Acting Director of the United States Patent and Trademark Office